(12) United States Patent
Tay et al.

(10) Patent No.: US 8,633,113 B2
(45) Date of Patent: Jan. 21, 2014

(54) METHOD FOR FABRICATING A BOTTOM OXIDE LAYER IN A TRENCH

(75) Inventors: Charlie Tay, Kulim Kedah (MY); Venkatesh Madhaven, Penang (MY); Arjun K. Kantimahanti, Penang (MY)

(73) Assignee: Silterra Malaysia Sdn Bhd, Kedah (MY)

( * ) Notice: Subject to any disclaimer, the term of this patent is extended or adjusted under 35 U.S.C. 154(b) by 0 days.

(21) Appl. No.: 13/477,670

(22) Filed: May 22, 2012

(65) Prior Publication Data

US 2012/0309200 A1    Dec. 6, 2012

(51) Int. Cl.
*H01L 21/311* (2006.01)

(52) U.S. Cl.
USPC ........... 438/702; 438/424; 438/270; 438/445; 438/637; 438/638; 257/E21.214; 257/E21.546

(58) Field of Classification Search
USPC ......... 438/702, 424, 270, 445, 637–638, 700; 257/E21.214, E21.546
See application file for complete search history.

(56) References Cited

U.S. PATENT DOCUMENTS

| | | | |
|---|---|---|---|
| 5,872,058 A | 2/1999 | Van Cleemput et al. | |
| 5,970,374 A * | 10/1999 | Teo ................................. | 438/629 |
| 6,265,269 B1 * | 7/2001 | Chen et al. ..................... | 438/270 |
| 6,335,261 B1 * | 1/2002 | Natzle et al. ................... | 438/435 |
| 6,429,148 B1 | 8/2002 | Chu et al. | |
| 6,709,952 B2 * | 3/2004 | Lai et al. ........................ | 438/424 |
| 6,780,731 B1 * | 8/2004 | Tu et al. .......................... | 438/424 |
| 6,800,509 B1 | 10/2004 | Lin et al. | |
| 6,958,276 B2 * | 10/2005 | Lin et al. ........................ | 438/270 |
| 7,015,112 B2 | 3/2006 | Wu et al. | |
| 7,371,641 B2 | 5/2008 | Montgomery | |
| 7,528,071 B2 * | 5/2009 | Kim et al. ...................... | 438/687 |
| 7,598,177 B2 * | 10/2009 | Cha et al. ....................... | 438/706 |
| 7,745,332 B1 * | 6/2010 | Shaviv et al. .................. | 438/679 |
| 7,964,504 B1 * | 6/2011 | Shaviv et al. .................. | 438/680 |
| 7,981,763 B1 * | 7/2011 | van Schravendijk et al. . | 438/424 |
| 8,298,936 B1 * | 10/2012 | Rozbicki et al. ............... | 438/637 |
| 2002/0142542 A1 * | 10/2002 | Jeng ................................ | 438/257 |
| 2004/0152271 A1 * | 8/2004 | Wu et al. ........................ | 438/270 |
| 2005/0037610 A1 * | 2/2005 | Cha et al. ....................... | 438/637 |
| 2007/0059900 A1 * | 3/2007 | Lai et al. ........................ | 438/435 |
| 2009/0191687 A1 * | 7/2009 | Hong et al. .................... | 438/423 |
| 2009/0286381 A1 * | 11/2009 | van Schravendijk et al. . | 438/435 |
| 2010/0041179 A1 * | 2/2010 | Lee ................................. | 438/104 |
| 2010/0078757 A1 * | 4/2010 | Eun ................................ | 257/506 |

* cited by examiner

*Primary Examiner* — N Drew Richards
*Assistant Examiner* — Ankush Singal
(74) *Attorney, Agent, or Firm* — Dickstein Shapiro LLP

(57) ABSTRACT

A method for fabricating a bottom oxide layer in a trench (102) is disclosed. The method comprises forming the trench (102) in a semiconductor substrate (100), depositing an oxide layer to partially fill a field area (104) and the trench (102), wherein said oxide layer has oxide overhang portions (106) and removing the oxide overhang portions (106) of the deposited oxide layer. Thereafter, the method comprises forming a bottom anti-reflective coating (BARC) layer (108) to cover the oxide layer in the field area (104) and the trench (102), removing the BARC layer (110) from the field area (104), while retaining a predetermined thickness of the BARC layer (112) in the trench (102), removing the oxide layer from the field area (104) and removing the BARC layer and oxide layer in the trench (102) to obtain a predetermined thickness of the bottom oxide layer (114).

8 Claims, 3 Drawing Sheets

METHOD FOR FABRICATING A BOTTOM OXIDE LAYER IN A TRENCH

FIELD OF INVENTION

The present invention relates generally to a method for fabricating a bottom oxide layer in a trench, more particularly a thick bottom oxide layer in a narrow-width deep-trench MOS.

BACKGROUND ART

Trench power MOSFET (or trench MOS) devices have a broad application within the semiconductor industry. More specifically, high aspect narrow-width deep-trench MOS devices are preferred due to the fact that these trenches provide better isolation between transistors, hence, improving significantly various electrical and physical properties of the device.

For high aspect narrow-width deep-trench MOS, a thick bottom oxide is required for the purpose of isolation in order to reduce the gate-drain charge, especially during high-speed switching. Due to its dimensions, conventional fabrication methods that employ the technique of grown oxide will not be able to provide efficient filling to obtain a thick bottom oxide in the narrow-width deep-trench.

SUMMARY OF INVENTION

The present invention provides a method for fabricating a bottom oxide layer in a trench, more particularly a thick bottom oxide layer in a narrow-width deep-trench MOS. The present invention proposes an efficient and cost-effective method for fabricating the thick bottom oxide layer in the narrow-width deep-trench MOS that is required to reduce gate-drain charge during high-speed switching.

One aspect of the present invention is a method for fabricating a bottom oxide layer in a trench. The method comprises (a) forming the trench in a semiconductor substrate, (b) depositing an oxide layer to partially fill a field area and the trench, wherein said oxide layer has oxide overhang portions, (c) removing the oxide overhang portions of the deposited oxide layer, (d) forming a bottom anti-reflective coating (BARC) layer to cover the oxide layer in the field area and the trench, (e) removing the BARC layer from the field area, while retaining a predetermined thickness of the BARC layer in the trench, (f) removing the oxide layer from the field area and (g) removing the BARC layer and oxide layer in the trench to obtain a predetermined thickness of the bottom oxide layer. The method further comprises growing oxide on the field area and a circumferential wall of the trench.

In one embodiment of the present invention, depositing the oxide layer to partially fill the field area and the trench further comprises using High Density Plasma (HDP) chemical vapor deposition to deposit the oxide layer to partially fill the field area and the trench, while removing oxide overhang portions of the deposited oxide layer further comprises wet etching of the oxide overhang portions using chemical compound comprising hydrofluoric acid.

In another embodiment of the present invention, removing the BARC layer from the field area, while retaining the predetermined thickness of the BARC layer in the trench further comprises dry plasma etching of the BARC layer using a high BARC-to-oxide selectivity. The predetermined thickness of the BARC layer in the trench (102) is retained such that the step (g) of removing the oxide layer from the field area (104) does not remove any oxide layer in the trench (102).

In yet another embodiment of the present invention, removing the oxide layer from the field area further comprises dry plasma etching of the oxide layer, while removing the BARC layer and oxide layer in the trench to obtain the predetermined thickness of the bottom oxide layer further comprises wet etching using chemical compound comprising hydrofluoric acid to obtain bottom oxide layer thickness between 0.15 µm to 0.3 µm.

The present invention consists of features and a combination of parts hereinafter fully described and illustrated in the accompanying drawings, it is being understood that various changes in the details may be made without departing from the scope of the invention or sacrificing any of the advantages of the present invention.

BRIEF DESCRIPTION OF THE ACCOMPANYING DRAWINGS

To further clarify various aspects of some embodiments of the present invention, a more particular description of the invention will be rendered by references to specific embodiments thereof, which are illustrated, in the appended drawings. It is appreciated that these drawings depict only typical embodiments of the invention and are therefore not to be considered limiting of its scope. The invention will be described and explained with additional specificity and detail through the accompanying drawings in which:

FIGS. 1 to 6 illustrate schematic cross-sectional sequential views of the method for fabricating a bottom oxide layer in a trench, in which:

FIG. 1 is a schematic diagram after High Density Plasma (HDP) chemical vapor deposition of a trench formed on a semiconductor substrate.

FIG. 2 is a schematic diagram after wet etching to pullback oxide overhang portions.

FIG. 3 is a schematic diagram after formation of a Bottom Anti-Reflective Coating (BARC) layer.

FIG. 4 is a schematic diagram after dry plasma etching to remove the BARC in a field area, while retaining a predetermined thickness of the BARC layer in the trench.

FIG. 5 is a schematic diagram after dry plasma etching to remove oxide deposition in the field area.

FIG. 6 is a schematic diagram after wet etching to obtain targeted oxide thickness in the trench.

DETAILED DESCRIPTION OF THE PREFERRED EMBODIMENTS

The present invention relates to a method for fabricating a bottom oxide layer in a trench. Hereinafter, this specification will describe the present invention according to the preferred embodiments of the present invention. However, it is to be understood that limiting the description to the preferred embodiments of the invention is merely to facilitate discussion of the present invention and it is envisioned that those skilled in the art may devise various modifications and equivalents without departing from the scope of the appended claims.

The present invention provides a method for fabricating a thick bottom oxide layer in a high aspect, narrow-width deep-trench MOS, the said method may be implemented using sub-micron toolsets. The thick bottom oxide layer is required for the purpose of isolation in order to reduce gate-drain charge during high-speed switching. The method according to the present invention is applied to narrow-width trenches, having a width dimension not exceeding 0.3 µm and deep-trenches, having depth dimensions exceeding 1.2 µm.

The various embodiments of the method according to the present invention provides efficient filling of the narrow-width (width<0.3 µm) and deep-trench (depth>1.2 µm) MOS that may not be achieved using the traditional grown oxide fabrication method. Additionally, the method according to the various embodiments of the present invention is cost-effective as it is simple and has a shorter cycle time as compared to the existing prior art method for fabricating thick bottom oxide for narrow-width, deep-trench MOS.

Reference is being made to FIGS. 1 to 6 collectively. FIGS. 1 to 6 illustrate schematic cross-sectional sequential views of the method for fabricating the bottom oxide layer in the trench according to the present invention.

The method according to the present invention begins with forming a narrow-width deep-trench (102) in a semiconductor substrate (100). The semiconductor substrate (100) may comprise of a silicon substrate or a glass substrate and the method of forming the narrow-width, deep-trench MOS may comprise, but is not limited to, the steps of depositing pad and/or masking layers and thereafter removing the said pad and/or masking layers using photolithography and etching. The trench is formed such that a circumferential wall (or sidewalls) of the trench is preferably perpendicular to the surface of the semiconductor substrate (100). To ensure that the surface of the bottom and the sidewalls of the trench are planar and are free of any undesired particles, a sacrificial oxide layer may be formed, by thermal oxidation, and thereafter removed.

Figure 1:
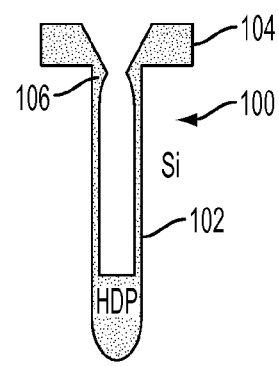

After the narrow-width deep-trench (102) is formed on the semiconductor substrate (100), an oxide layer (silicon oxide layer) is deposited on the semiconductor substrate (100) and the trench (102) by a vapor deposition process. The oxide layer is deposited to partially fill a field area (104) on the semiconductor substrate (100) as well as the bottom and the sidewalls of the trench (102). The vapor deposition process preferably comprises a chemical vapor deposition process, and more preferably a High Density Plasma (HDP) chemical vapor deposition process. The HDP chemical vapor deposition process provides efficient filling of the narrow-width (width<0.3 µm) and deep-trench (depth>1.2 µm) MOS. FIG. 1 is a schematic diagram after HDP chemical vapor deposition of the trench formed on the semiconductor substrate.

Figure 2:
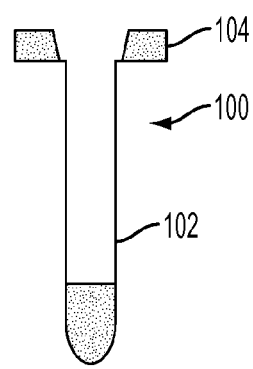

As shown in FIG. 1, due to the nature of HDP chemical vapor deposition and the narrow dimensions of the trench (102), oxide overhang portions (106) are formed surrounding the top corners or opening of the trench. These oxide overhang portions (106) further narrow the opening of the trench (102) making it difficult to ensure proper formation of a bottom anti-reflective coating (BARC) layer. Therefore, prior to forming the BARC layer, the oxide overhang portions (106) are removed by an etching process, preferably a wet etching process using chemical compound comprising preferably hydrofluoric acid. FIG. 2 is a schematic diagram after the wet etching process to pullback the oxide overhang portions. As shown in FIG. 2, the wet etching process removes the oxide overhang portions (106) as well as the oxide along the sidewalls of the trench. Thus the oxide layer that remains after the wet etching process is within the field area (104) on the semiconductor substrate (100) as well as in the bottom of the trench (102).

Figure 3:
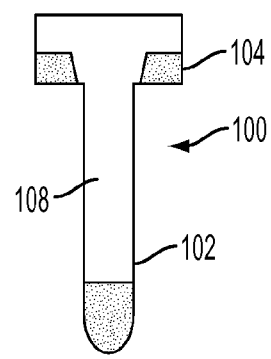

Once the oxide overhang portions (106) have been removed, the BARC layer (108) is formed to cover the oxide layer that remains in the field area (104) on the semiconductor substrate (100) and the bottom of the trench (102) as shown in FIG. 3.

Figure 4:
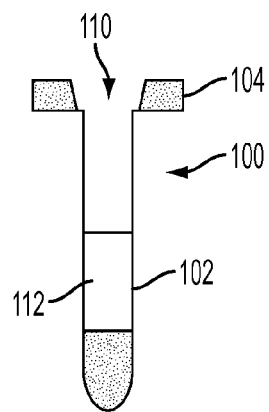

Thereafter, the BARC layer (110) from the field area (104) on the semiconductor substrate (100) is removed by a dry plasma etching process, while a predetermined thickness of the BARC layer (112) is retained in the trench (102). FIG. 4 is a schematic diagram after the dry plasma etching process to remove the BARC in the field area, while retaining a predetermined thickness of the BARC layer in the trench. The dry plasma etching process uses a high BARC-to-oxide selectivity in order to remove the BARC layer (110) from the field area (104) on the semiconductor substrate while retaining the predetermined thickness of the BARC layer (112) in the trench (102). The predetermined thickness of the BARC layer in the trench (102) is retained such that the following step of removing the oxide layer from the field area (104) does not remove any oxide layer in the trench (102).

Figure 5:
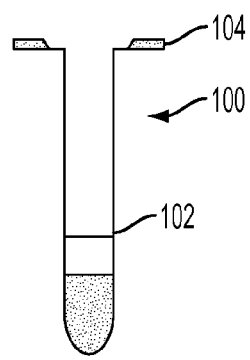

Once the BARC layer (110) is removed, the oxide layer from the field area (104) on the semiconductor substrate (100) is removed by an etching process, preferably a dry plasma etching process. FIG. 5 is a schematic diagram after the dry plasma etching process to remove oxide deposition in the field area on the semiconductor substrate.

Figure 6:
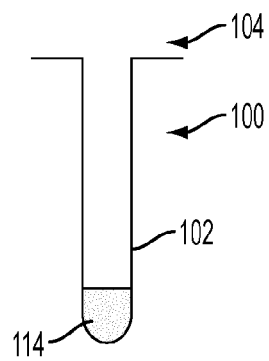

To obtain the desired thickness of the bottom oxide layer (114) which is between 0.15 µm to 0.3 µm, the BARC layer and oxide layer in the trench (102) is removed by an etching process, preferably a wet etching of the oxide layer using chemical compound comprising hydrofluoric acid. FIG. 6 is a schematic diagram after the wet etching process to obtain targeted oxide thickness in the trench.

The combination sequence of a dry plasma etching process followed by a wet etching process to remove the oxide layer from the field area (104) on the semiconductor substrate (100) and the oxide layer in the trench (102) respectively in order to obtain the desired thickness of the bottom oxide layer (114) is crucial. This is because, with the dry plasma etching process to remove the oxide layer from the field area (104), the possibility of hydrofluoric acid seeping through small openings (or keyholes) causing oxide erosion during wet etching process may be reduced or possibly eliminated. Wet etching process is then used once the BARC layer has been completely removed in order to obtain the desired thickness of the bottom oxide layer (114).

Figure 7:
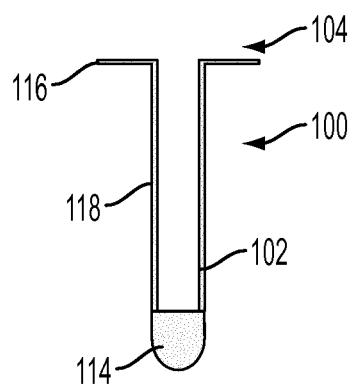
FIG. 7 is a schematic cross-sectional view of the trench with grown oxide whereby the trench is ready for poly gate deposition.

Reference is now made to FIG. 7. FIG. 7 is a schematic cross-sectional view of the trench with grown oxide whereby the trench is ready for poly gate deposition. Once the desired thickness of the bottom oxide layer (114) is obtained, the trench (102) on the semiconductor substrate (100) is prepared for oxide growth to obtain a desired thickness of a grown oxide layer on the field area (116) on the semiconductor substrate (100) and a circumferential wall or sidewalls (118) of the trench (102). Thereafter, the trench (102) is ready for poly gate deposition as well as various other processes to complete the fabrication of the narrow-width deep-trench MOS.

Therefore, according to the various embodiments of the present invention, the narrow-width deep-trench MOS having width not exceeding 0.3 µm and depth exceeding 1.2 µm may be fabricated to have the thick bottom oxide layer (114) that is required to reduce gate-drain charge, that is in excess of 10% during high-speed switching, while having the grown oxide layer with desired thickness on the semiconductor substrate (100) and sidewalls (118) of the trench (102).

The invention claimed is:

1. A method for fabricating a bottom oxide layer in a trench, the method comprising:

forming the trench in a semiconductor substrate;

depositing an oxide layer to partially fill a field area and the trench, wherein said oxide layer has oxide overhang portions;

removing the oxide overhang portions of the deposited oxide layer by wet etching of the oxide overhang portions and a circumferential wall of the trench using chemical compound comprising hydrofluoric acid;

forming a bottom anti-reflective coating (BARC) layer to cover the oxide layer in the field area and the trench;

removing the BARC layer from the field area, while retaining a predetermined thickness of the BARC layer in the trench by performing dry plasma etching of the BARC layer using a high BARC-to-oxide selectivity;

removing the oxide layer from the field area; and removing the BARC layer and oxide layer in the trench to obtain a predetermined thickness of the bottom oxide layer.

2. A method according to claim 1 wherein, forming the trench in the semiconductor substrate further comprises forming a recess with a maximum width of 0.3 μm and a minimum depth of 1.2 μm, wherein a circumferential wall of the trench is substantially perpendicular to the semiconductor substrate surface.

3. A method according to claim 1 wherein, depositing the oxide layer to partially fill the field area and the trench further comprises using High Density Plasma (HDP) chemical vapor deposition to deposit the oxide layer to partially fill the field area and the trench.

4. A method according to claim 1 wherein, removing the BARC layer from the field area, while retaining the predetermined thickness of the BARC layer in the trench further comprises retaining the predetermined thickness of the BARC layer in the trench such that the step of removing the oxide layer from the field area does not remove any oxide layer in the trench.

5. A method according to claim 1 wherein, removing the oxide layer from the field area further comprises dry plasma etching of the oxide layer.

6. A method according to claim 1 wherein, removing the BARC layer and oxide layer in the trench to obtain the predetermined thickness of the bottom oxide layer further comprises wet etching using chemical compound comprising hydrofluoric acid to obtain bottom oxide layer thickness between 0.15 μm to 0.3 μm.

7. A method according to claim 1 wherein the method further comprises growing oxide on the field area and a circumferential wall of the trench.

8. A method for fabricating a bottom oxide layer in a trench, the method comprising:

forming the trench in a semiconductor substrate;

depositing an oxide layer to partially fill a field area and the trench, wherein said oxide layer has oxide overhang portions;

removing the oxide overhang portions of the deposited oxide layer;

forming a bottom anti-reflective coating (BARC) layer to cover the oxide layer in the field area and the trench;

removing the BARC layer from the field area, while retaining a predetermined thickness of the BARC layer in the trench;

removing the oxide layer from the field area; and removing the BARC layer and oxide layer in the trench to obtain a predetermined thickness of the bottom oxide layer, and wherein, removing the BARC layer from the field area, while retaining the predetermined thickness of the BARC layer in the trench further comprises dry plasma etching of the BARC layer using a high BARC-to-oxide selectivity.

* * * * *